(12) United States Patent
Gribben

(10) Patent No.: US 12,323,112 B1
(45) Date of Patent: Jun. 3, 2025

(54) SIGNAL AMPLIFIER

(71) Applicant: Dialog Semiconductor (UK) Limited, London (GB)

(72) Inventor: Anthony Gribben, Edinburgh (GB)

(73) Assignee: Renesas Design (UK) Limited, Bourne End (GB)

( * ) Notice: Subject to any disclaimer, the term of this patent is extended or adjusted under 35 U.S.C. 154(b) by 472 days.

(21) Appl. No.: 17/514,280

(22) Filed: Oct. 29, 2021

(51) Int. Cl.
*H03F 3/217* (2006.01)
*H04R 3/02* (2006.01)
*H04R 3/04* (2006.01)

(52) U.S. Cl.
CPC .............. *H03F 3/217* (2013.01); *H04R 3/02* (2013.01); *H04R 3/04* (2013.01); *H03F 3/2173* (2013.01); *H03F 2200/03* (2013.01)

(58) Field of Classification Search
CPC ........ H03F 3/217; H03F 2200/03; H03F 3/38; H03F 3/2173; H03F 3/2171; H03F 2200/351; H04R 3/02; H04R 3/04
USPC ........................................ 330/10, 207 A, 251
See application file for complete search history.

(56) References Cited

U.S. PATENT DOCUMENTS

| | | | |
|---|---|---|---|
| 7,227,408 B2 | 6/2007 | Candy | |
| 7,795,969 B2 * | 9/2010 | Esguevillas | ........... H03F 1/3264 330/297 |
| 7,965,138 B2 | 6/2011 | Teplechuk | |
| 8,164,382 B2 | 4/2012 | Teplechuk | |
| 8,643,436 B2 | 2/2014 | Ni et al. | |
| 8,890,608 B2 | 11/2014 | Sahandiesfanjani et al. | |
| 9,444,419 B2 | 9/2016 | Petersen | |
| 9,515,617 B2 | 12/2016 | Hoyerby | |
| 9,793,867 B2 | 10/2017 | Frith et al. | |
| 9,985,587 B2 * | 5/2018 | He | ............. H03F 1/32 |
| 10,256,779 B2 * | 4/2019 | Polarouthu | ........... H03F 1/0211 |
| 10,284,155 B2 | 5/2019 | Hoyerby | |

OTHER PUBLICATIONS

US Notice of Allowance, U.S. Appl. No. 17/562,991, Applicant: Anthony Gribben, Mail date: Mar. 10, 2023, 12 pages.
"Tracking Multilevel Power Supplies for Class-D Audio Amplifiers," IEEE Journal of Emerging and Selected Topics in Power Electronics, vol. 9, No. 1, Feb. 2021, pp. 156-166.
ESS Technology, "The ES8018 SARE Smart Power Amplifier," 3 pages, Copyright © 2019 ESS Technology.

(Continued)

*Primary Examiner* — Khanh V Nguyen
(74) *Attorney, Agent, or Firm* — Saile Ackerman LLC; Stephen B. Ackerman

(57) ABSTRACT

A signal amplifier includes a modulator circuit, a power converter and a H-bridge circuit. The modulator circuit generates a first logic signal by comparing an input signal with a first waveform and generates a second logic signal by comparing the input signal with a second waveform. The power converter provides a first voltage and a second voltage. The H-bridge circuit has a first input terminal to receive the first voltage, a second input terminal to receive the second voltage and a pair of output terminals for providing an output modulated voltage to a load. The H-bridge circuit generates the output modulated voltage using a primary modulation when the second logic signal is in a first logic state and using a secondary modulation when the second logic signal is in a second logic state.

19 Claims, 15 Drawing Sheets

(56) References Cited

OTHER PUBLICATIONS

Embedded Single-Inductor Bipolar-Output DC-DC Converter in Class-D Amplifier for Low Common Noise, IEEE Transactions on Power Electronics, vol. 31, No. 4, Apr. 2016, pp. 3106-3117.

IEEE Journal of Solid-State Circuits, "True Filterless Class-D Audio Amplifier," vol. 46 Issue: 12, Mykhaylo A. Teplechuk et al., Dec. 2011, pp. 2784-2793.

ISSCC 2011, Session 13, Analog Techniques, 13.3, "Filterless Integrated Class-D Audio Amplifier Achieving 0.0012% THD+N and 96dB PSRR When Supplying 1.2W." Mykhaylo A. Teplechuk et al., Feb. 20-24, 2011, pp. 9-11.

\* cited by examiner

SIGNAL AMPLIFIER

FIELD OF THE DISCLOSURE

The present disclosure relates to a signal amplifier, and in particular to a multi-level class D amplifier.

BACKGROUND

Multi-level Class D Amplifiers are emerging as the preferred option for audio applications, due to their good efficiency, small footprint and reduced electromagnetic interference (EMI). Various topologies have been reported in US patent documents U.S. Pat. No. 8,643,436, U.S. Ser. No. 10/284,155, U.S. Pat. No. 9,793,867 and scientific publications including Chen, "Embedded Single-Inductor Bipolar-Output DC-DC Converter in Class-D Amplifier for Low Common Noise", IEEE, 2016; Dahl et al, "Tracking Multilevel Power Supplies for Class-D Audio Amplifiers", IEEE 2021; and ESS Technology, "The ES8018 SABRE Smart Power Amplifier" 2019.

In many instances, a switched-capacitor structure is used to either multiply or divide a supply voltage. As the audio output signal crosses a supply step, the next supply level has to be selected. This approach affects the fidelity of the audio output, especially if the audio is continually crossing the boundary.

Moreover, using the full supply range requires full (100%) modulation which can lead to audio artifacts.

SUMMARY OF THE DISCLOSURE

It is an object of the disclosure to address one or more of the above mentioned limitations.

According to a first aspect of the disclosure, there is provided a signal amplifier comprising a modulator circuit (630, 640) adapted to generate a first logic signal (PWM1) by comparing an input signal with a first waveform (W1); and to generate a second logic signal (PWM2) by comparing the input signal with a second waveform (W2); a power converter (655) adapted to provide a first voltage and a second voltage; a H-bridge circuit having a first input terminal to receive the first voltage, a second input terminal to receive the second voltage and a pair of output terminals for providing an output modulated voltage to a load; the H-bridge circuit being adapted to generate the output modulated voltage using a primary modulation when the second logic signal (PWM2) is in a first logic state and using a secondary modulation when the second logic signal (PWM2) is in a second logic state.

For instance the first logic state may be a logic low (logic 0) and the second logic state may be a logic high (logic 1).

Optionally, the first waveform is a first triangular waveform.

Optionally, the first triangular waveform (W1) varies between ground and a rail voltage (Vdd).

Optionally, the second waveform (W2) is a second triangular waveform.

Optionally, the second triangular waveform (W2) varies between the rail voltage (Vdd) and an intermediate voltage, the intermediate voltage having a value that is less than the rail voltage (Vdd).

Optionally, the second triangular waveform (W2) has a period comprising a first portion during which the waveform remains at a constant value, and a second portion during which the waveform varies between the rail voltage (Vdd) and the intermediate voltage.

Optionally, the first triangular waveform (W1) and the second triangular waveform (W2) are synchronized.

Optionally, the H-bridge circuit comprises a first switch (S1) to couple a first output terminal (C) to the first input terminal (A); a second switch (S2) to couple the first output terminal (C) to ground; a third switch (S3) to couple a second output terminal (D) to the first input terminal (A); a fourth switch (S4) to couple the second output terminal (D) to ground; a fifth switch (S2B) to couple the first output terminal (C) to the second input terminal (B); a sixth switch (S4B) to couple the second output terminal (D) to the second input terminal (B).

Optionally, the power converter is a step-up converter.

Optionally, the power converter is a step-down converter.

Optionally, the H-bridge circuit is operable in a first mode when the input signal has an amplitude within a first region, a second mode when the input signal has an amplitude within a second region, and a third mode when the input signal has an amplitude within a third region.

For instance the first region may correspond to a relatively low amplitude input signal, the third region to a relatively high amplitude input signal, and the second region to a medium amplitude input signal.

Optionally, the first voltage and the second voltage provided by the power converter have different values in different modes.

Optionally, in the first mode, the primary modulation is between a first voltage value (vlevel1) and ground, and the secondary modulation is between the first voltage value (vlevel1) and a second voltage value (vlevel2).

For instance, the first voltage value (vlevel1) may have an absolute amplitude greater than the ground voltage and the second voltage value (vlevel2) may have an absolute amplitude greater than the first voltage value (vlevel1).

For example the output modulated voltage may be modulated using the primary modulation between a first voltage value (vlevel1) and ground, and upon trigger of the second logic signal (PWM2) the output modulated voltage is modulated using the secondary modulation between the first voltage value (vlevel1) and the second voltage value (vlevel2).

Optionally, in the second mode, the primary modulation is between the second voltage value (vlevel2) and the first voltage value (vlevel1), and the secondary modulation is between the second voltage value (vlevel2) and a third voltage value (vlevel3).

For instance, the third voltage value (vlevel3) may have an absolute amplitude greater than the second voltage value (vlevel2).

For example the output modulated voltage may be modulated using the primary modulation between the second voltage value (vlevel2) and the first voltage value (vlevel1), and upon trigger of the second logic signal (PWM2) the output modulated voltage is modulated using the secondary modulation between the second voltage value (vlevel2) and the third voltage value (vlevel3).

Optionally, in the third mode, the primary modulation is between the third voltage value (vlevel3) and the second voltage value (vlevel2).

Optionally, the signal amplifier is a multi-level class D amplifier. For example, the class D amplifier may be a multi-level boosted class D amplifier or a multi-level bucked class D amplifier.

Optionally, one output terminal is directly connected to ground.

According to a second aspect of the disclosure, there is provided a method of amplifying an input signal, the method comprising receiving an input signal;

generating a first logic signal by comparing the input signal with a first waveform;

generating a second logic signal by comparing the input signal with a second waveform;

providing a power converter adapted to provide a first voltage and a second voltage;

providing a H-bridge circuit having a first input terminal to receive the first voltage, a second input terminal to receive the second voltage and a pair of output terminals for providing an output modulated voltage to a load;

generating the output modulated voltage using a primary modulation when the second logic signal is in a first logic state and using a secondary modulation when the second logic signal is in a second logic state; and applying the modulated output voltage to the load.

Optionally, the output modulated voltage has a duty cycle and when the duty cycle is below a threshold value the output modulated voltage is modulated using the primary modulation and when the duty cycle is equal or greater than the threshold value the output modulated voltage is modulated using the secondary modulation.

Optionally, the method comprises controlling the H-bridge using the first logic signal (PWM1) and controlling the power converter using the second logic signal (PWM2).

BRIEF DESCRIPTION OF THE DRAWINGS

The disclosure is described in further detail below by way of example and with reference to the accompanying drawings, in which.

DETAILED DESCRIPTION

Figure 1:
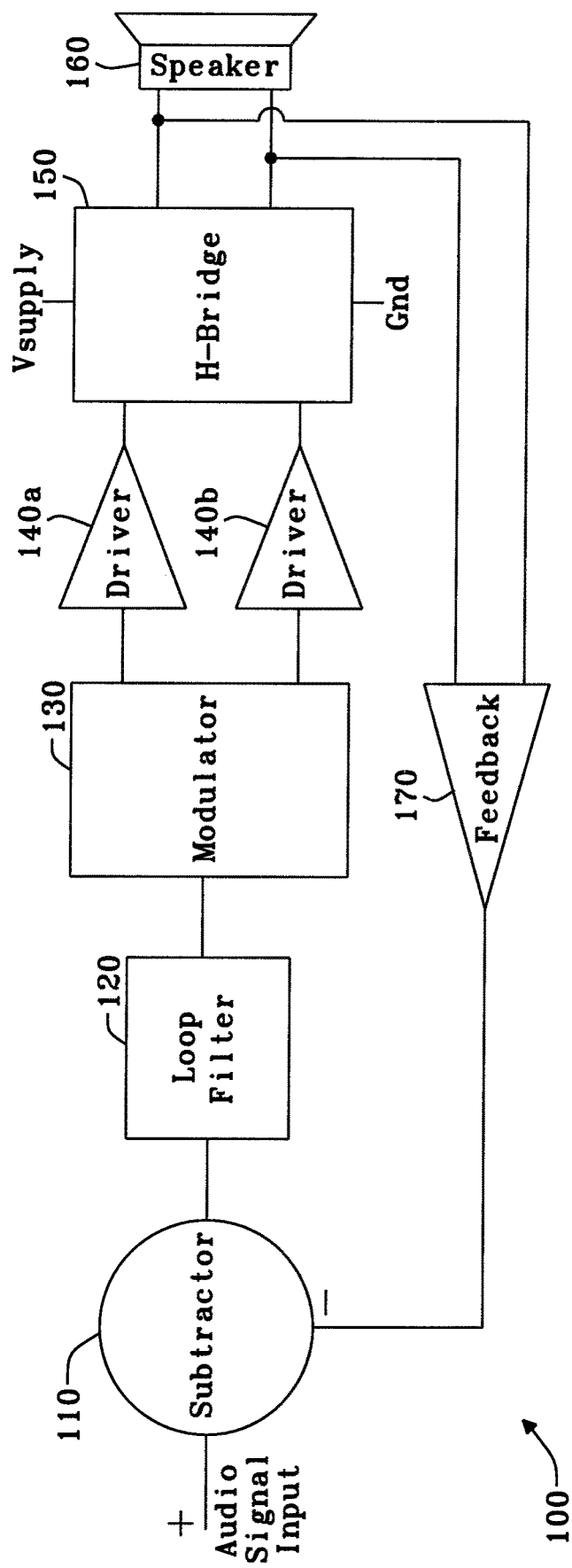
FIG. 1 is a diagram of a conventional class D audio amplifier.

FIG. 1 illustrates a conventional class D audio amplifier. The audio amplifier 100 includes a subtractor 110, a low pass filter 120, a signal modulator 130, a pair of high side and low side drivers 140a, 140b, a H-bridge circuit 150, a transducer such as a speaker 160 and a feedback circuit or feedback component 170 arrange d in a feedback loop. The feedback circuit 170 provides a feedback signal that is a representation of the output signal. For instance the feedback circuit 170 may be an amplifier, a resistor, or an analog-to-digital ADC circuit.

In operation, the subtractor 110 receives an audio input signal from an audio source (not shown) and a feedback signal from the feedback circuit 170. The subtractor 110 subtracts the audio input signal from the feedback signal to generate an error signal. The error signal is then passed to the filter 120 for filtering out the residual high frequency component of the signal. The filtered signal is then modulated to a higher frequency using the modulator 130. The modulated signal is then used by the high side and low side drivers to operate the H-bridge circuit. The H-bridge circuit 150 switches the polarity of the voltage applied to the speakers following the modulated signal, hence generating an amplified audio signal. The gain is determined by the ratio of the feedback to the input. The H-Bridge circuit 150 switches differential outputs at high frequency with a duty cycle proportional to the required output. Negative feedback ensures the accuracy of the output and helps eliminate inaccuracies in the forward path and H-Bridge supplies.

Figure 2:
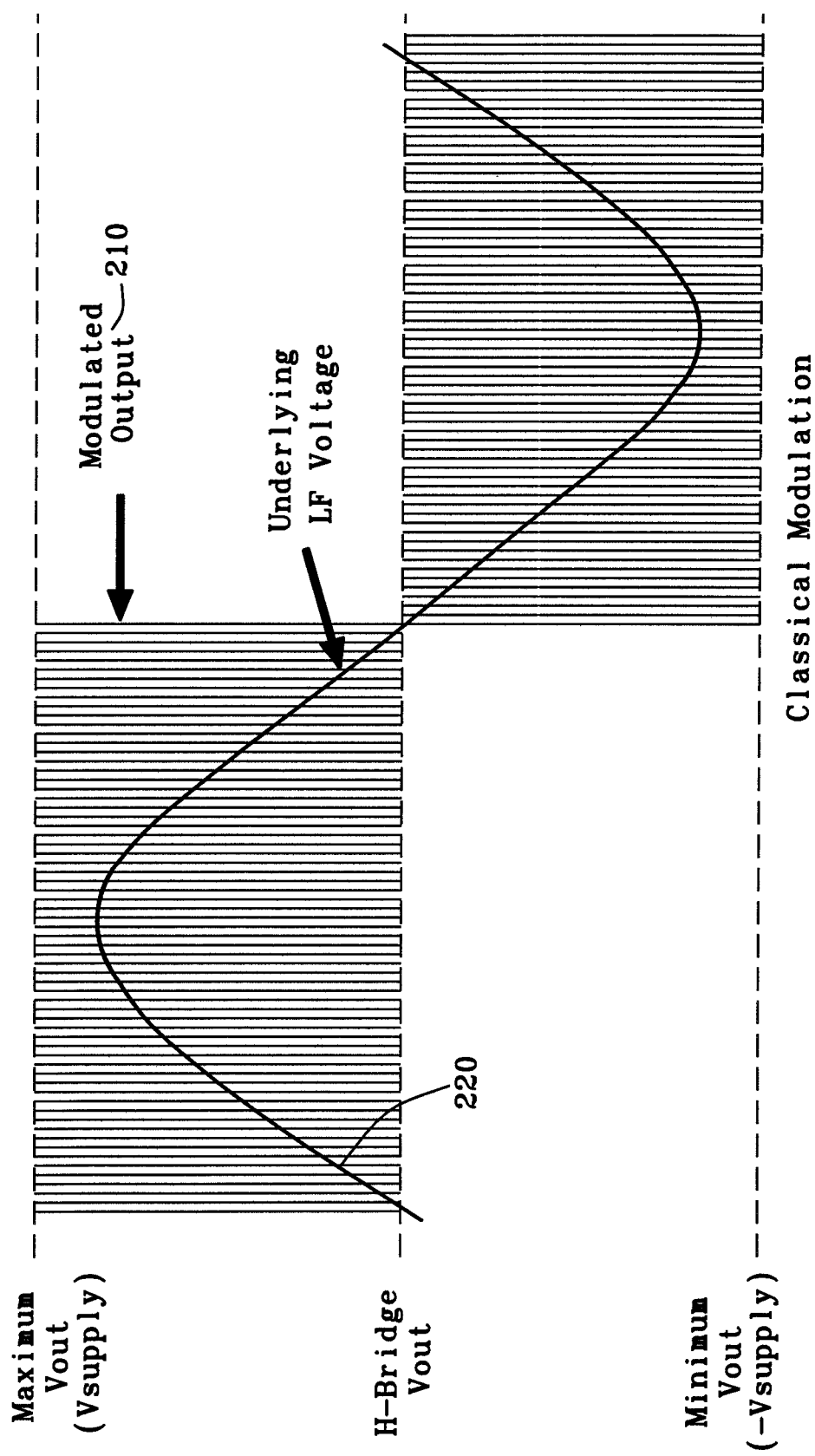
FIG. 2 is a waveform diagram showing the modulated output voltage generated by the audio amplifier of FIG. 1.

FIG. 2 is a waveform diagram showing the modulated output voltage 210 generated at the output terminal of the H-bridge, and the underlying average output voltage Vout 220 applied to the speaker 160. The modulated output voltage 210 can be either positive or negative. The H-Bridge has two output ports: a positive port and a negative port coupled to the transducer. A positive output voltage is achieved by driving the supply voltage Vsupply on the positive port of the H-Bridge. Similarly a negative output voltage is achieved by driving Vsupply on the negative port of the H-Bridge. No negative rails are generated. To produce more signal at the output, a separate boost circuit (not shown) can be used to increase the supply voltage and produce greater signal amplitude.

Figure 3:
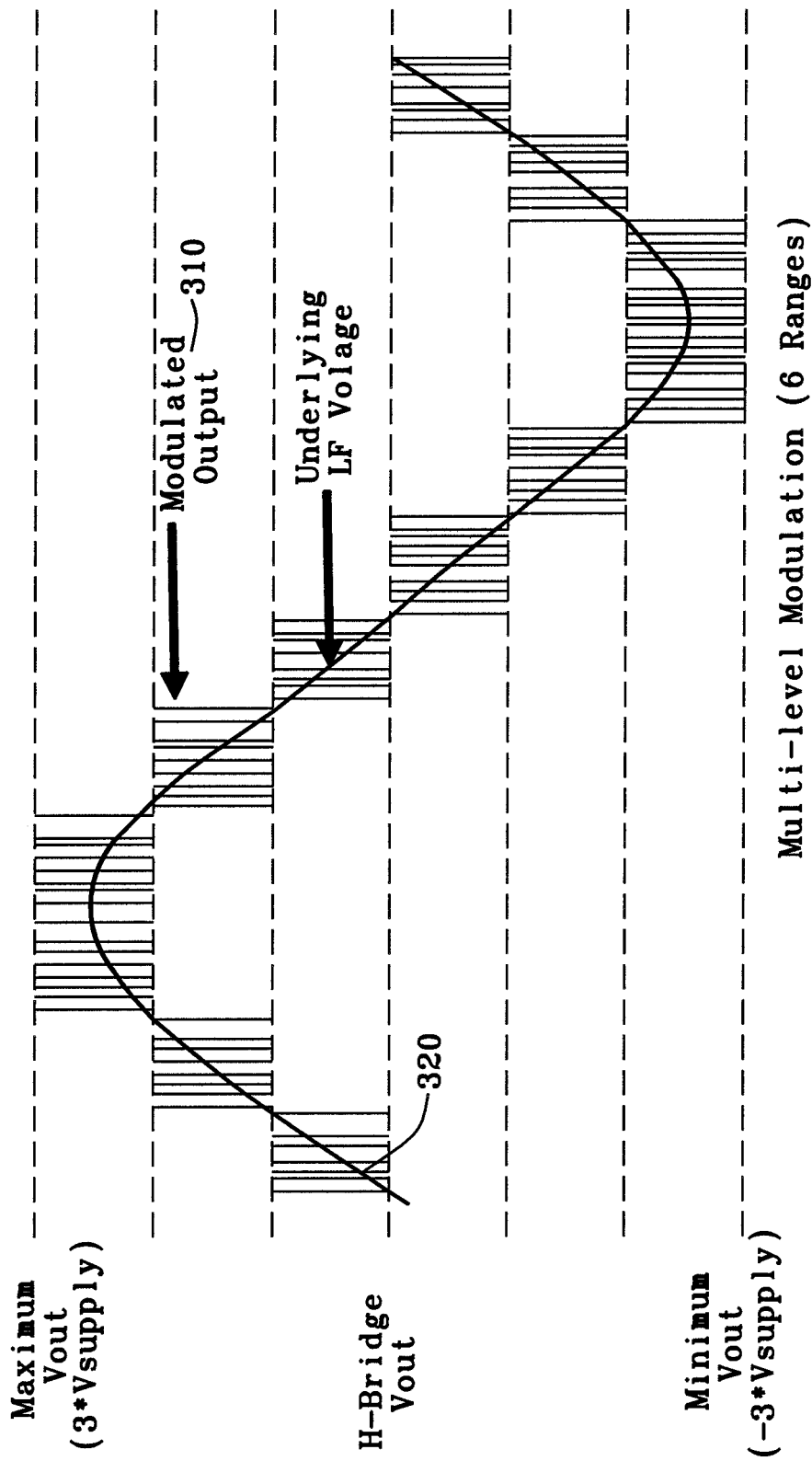
FIG. 3 is a waveform diagram showing a multi-level modulated output voltage generated using seven levels by boosting a supply voltage.

FIG. 3 is a waveform diagram showing the multi-level modulated output voltage 310 generated at the output terminals of the H-bridge and the corresponding average output voltage Vout 320 applied to the speaker 160. In this example six range s (seven levels) are used. Multi-level modulated output voltages can be used to improve efficiency and minimize EMI radiation by reducing the amplitude of the switched steps. Multi-level modulated signals can be generated using capacitive multiplication to generate integer multiples of the supply voltage. Alternatively a divider producing integer sub-multiples could be used. Inductive techniques may also be envisioned.

Figure 4:
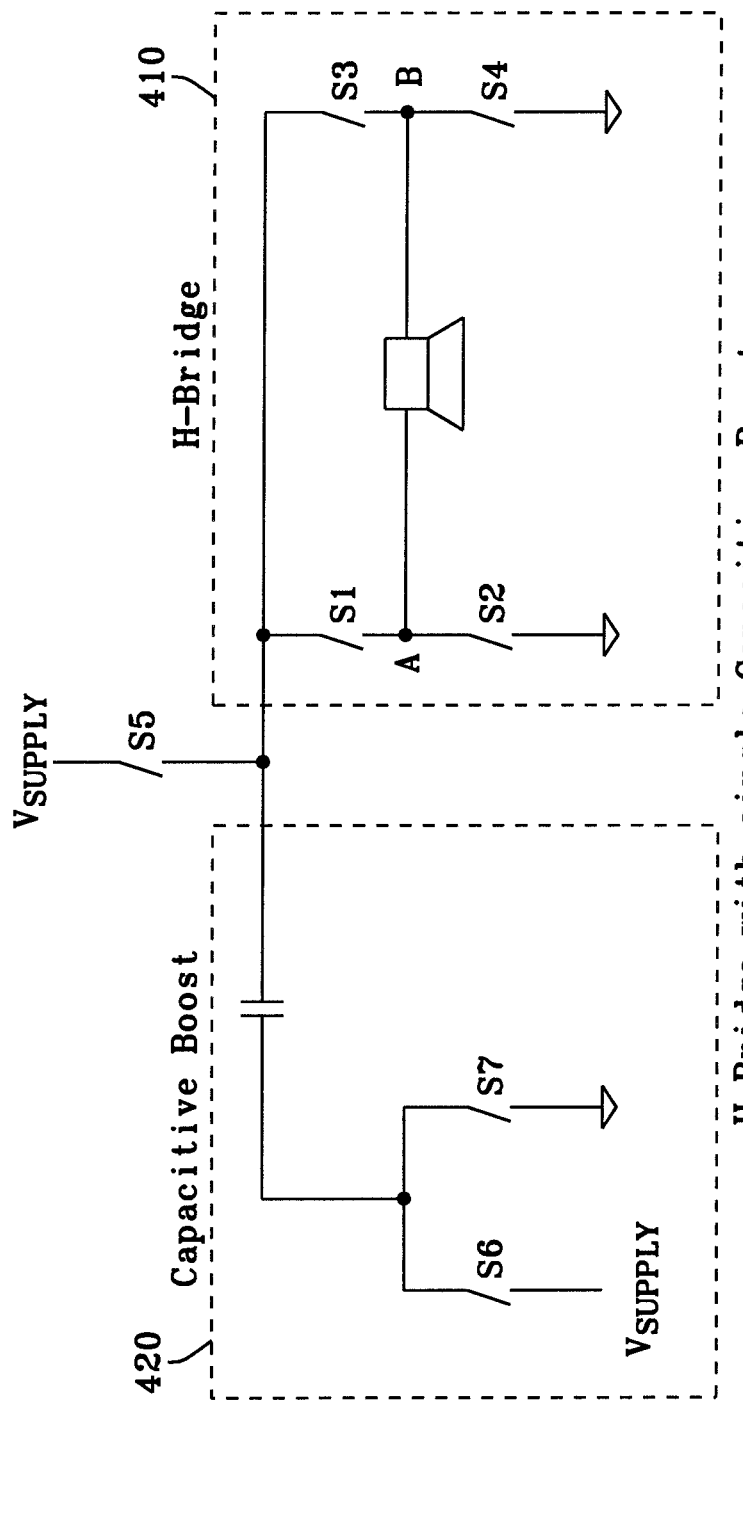
FIG. 4 is a diagram of a conventional H-bridge circuit coupled to a capacitive boost converter.

FIG. 4 shows a conventional H-bridge circuit 410 coupled to a two-times capacitive boost converter 420. The H-bridge circuit 410 has a first output (positive port A) coupled to a first terminal of the speaker and a second output (negative port B) coupled to a second terminal of the speaker. The first output A is coupled to the rail voltage Vsupply via switch S1 and to ground via switch S2. Similarly, the second output B is coupled to the rail voltage Vsupply via switch S3 and to ground via switch S4. The capacitive boost converter 420 has a capacitor having a first terminal coupled to the rail voltage Vsupply via switch S5 and a second terminal that is either coupled ground via switch S7 or to Vsupply via switch S6.

For low signal outputs, S5 remains closed and the audio signal is driven by the conventional H-Bridge consisting of switches, S1 to S4. When the output either exceeds +Vsupply or goes below −Vsupply, the polarity of the output is defined by S1 to S4 and the modulation is achieved by S5 to S7. For the low level, S5 and S7 are closed, charging the cap to Vsupply and driving the load. In the high state, S6 is closed, driving the output to twice Vsupply using the charge stored in the capacitor. Using this approach, it is difficult to maintain audio fidelity as the audio output crosses the level boundary. When the target signal reaches the top of a particular voltage range, it may be required to modulate the signal with a duty cycle of up to 100%. This can lead to audio artifacts due to low frequency signals in the patterns.

Figure 5:
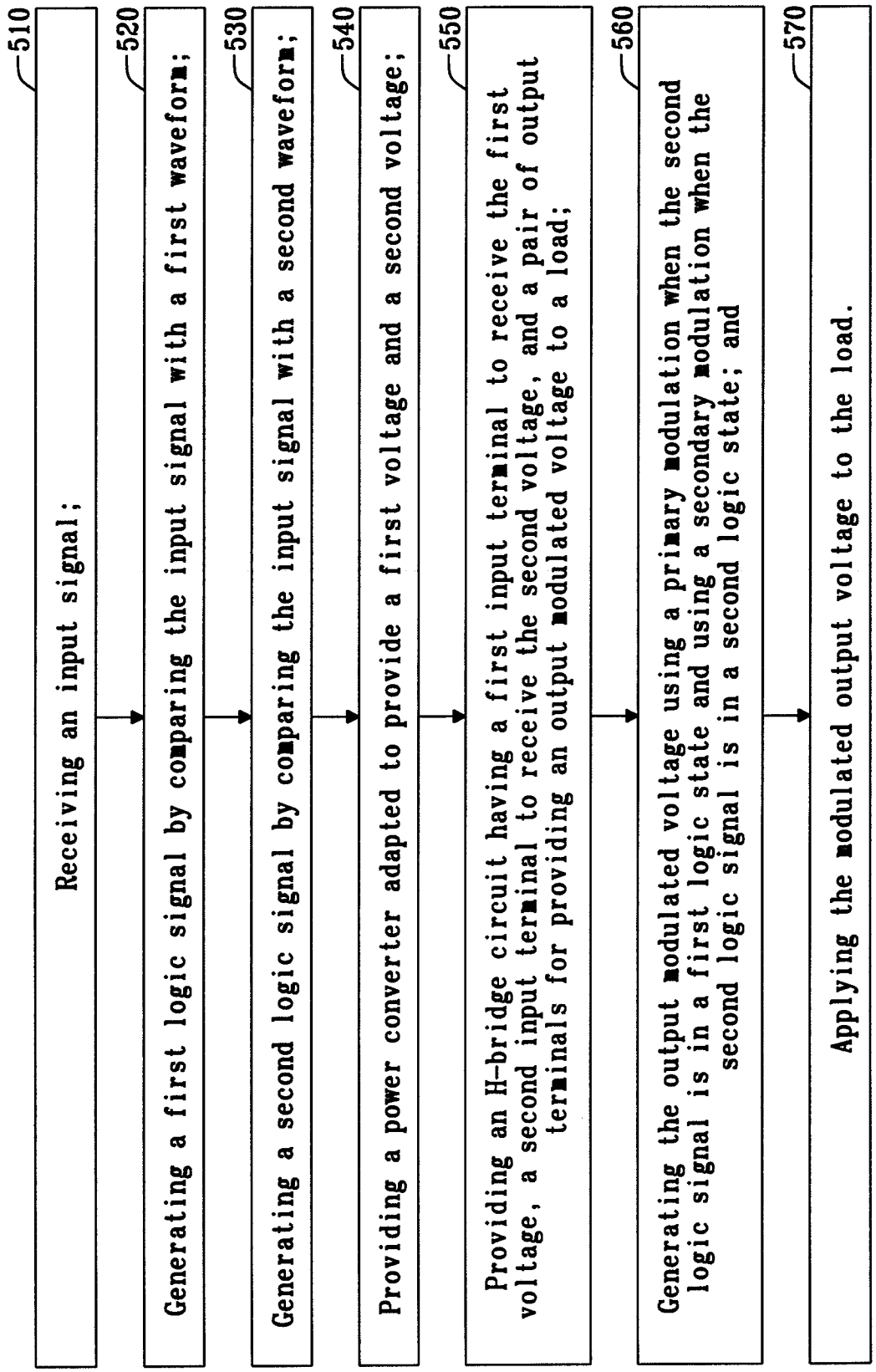
FIG. 5 is a flow diagram of a method for amplifying a signal according to the disclosure.

FIG. 5 is a flow diagram of a method for amplifying a signal according to the disclosure.

At step 510, an input signal is received. For instance, the input signal may be an audio signal.

At step 520 a first logic signal is generated by comparing the input signal with a first waveform. For instance the first waveform may be a first triangular waveform. For instance, the first triangular waveform may vary between ground and a rail voltage.

At step 530 a second logic signal is generated by comparing the input signal with a second waveform. For instance the second waveform may be a second triangular waveform. For instance the second triangular waveform may be a pulsed triangular wave that varies between the rail voltage and an intermediate voltage, the intermediate voltage having a value that is less than the supply voltage.

At step 540 a power converter is provided, the power converter being adapted to deliver a first voltage and a second voltage.

At step 550 an H-bridge circuit is provided. The H-bridge circuit has a first input terminal to receive the first voltage, a second input terminal to receive the second voltage and a pair of output terminals for providing an output modulated voltage to a load. For instance, the H-bridge circuit may be a multi-level H-bridge circuit in which both the upper and lower rails can be switched.

At step 560 the output modulated voltage is generated using a primary modulation when the second logic signal is in a first logic state and using a secondary modulation when the second logic signal is in a second logic state. For instance the first logic state may be a logic low (logic 0) and the second logic state may be a logic high (logic 1).

At step 570 the modulated output voltage is applied to the load. For example, the load may be a transducer such as an audio speaker or a haptic device.

The method of FIG. 5 is not limited to any particular sequence of events as the steps of the method may be implemented in various order or simultaneously. For instance the steps 520 and 530 may occur at the same time. Additional intermediate steps may also be included in the method.

This method can be applied to Class D amplification, for instance amplification circuits including analog and/or digital Class D control loops. This permits to provide a smooth, continuous, transition from one Class D output level to another without impacting on audio fidelity.

Figure 6:
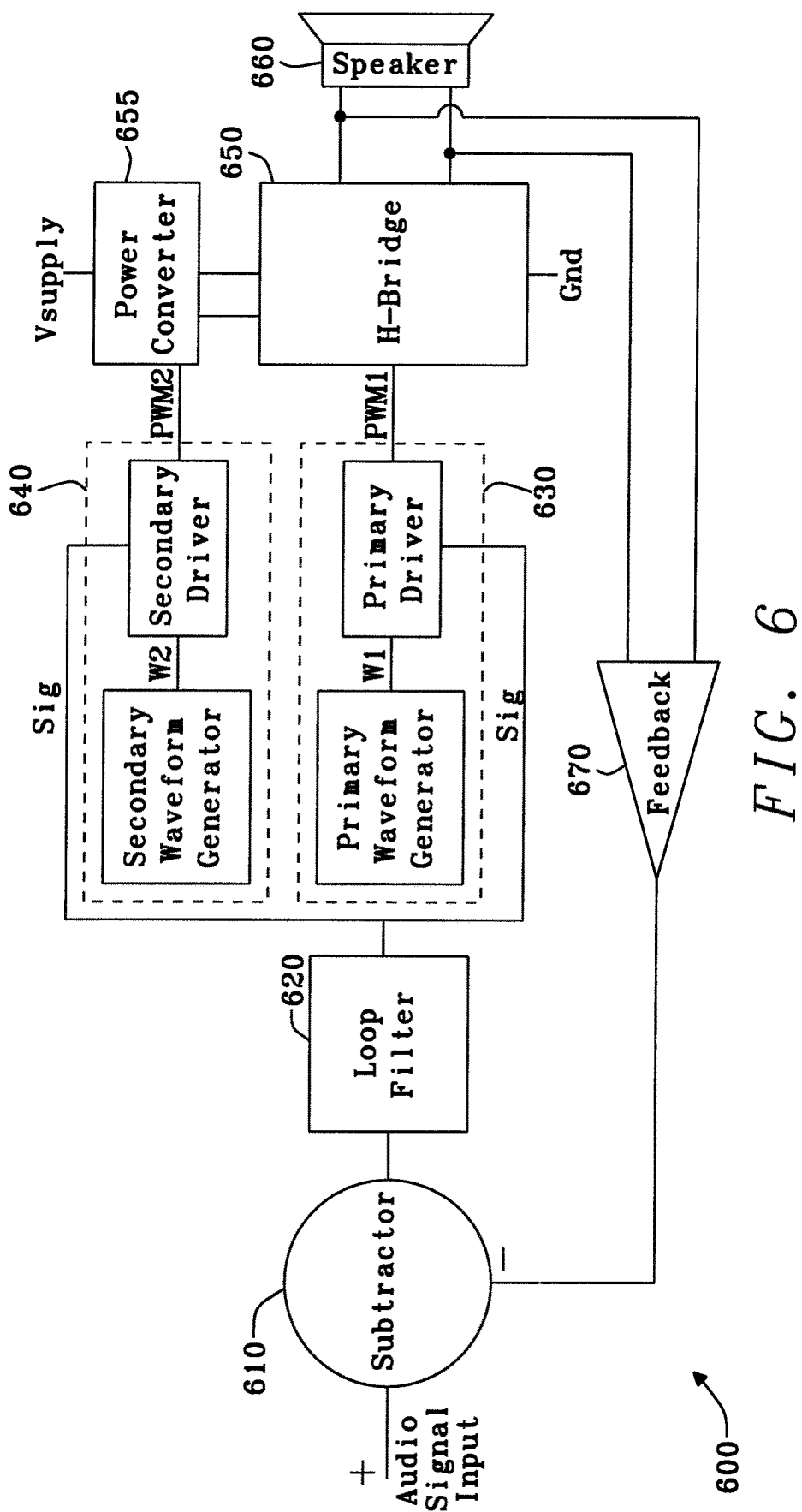
FIG. 6 is a diagram of a signal amplification circuit for implementing the method of FIG. 5.

FIG. 6 is a diagram of a signal amplification circuit for implementing the method of FIG. 5.

The audio amplifier 600 includes a subtractor 610, a low pass filter 620, a modulator circuit (630, 640), and a H-bridge circuit 650 coupled to a load, which in this case is an audio speaker 660. A feedback circuit 670 is provided in a feedback loop between the output of the H-bridge and the subtractor 610. The feedback circuit 670 provides a feedback signal that is a representation of the output signal. For instance the feedback circuit 670 may be implemented as an amplifier, a resistor, or an analog-to-digital ADC circuit. A power converter (655) is coupled to the H-bridge 650 for providing a first voltage and a second voltage (for instance first and second rail voltages). Depending on the application, the power converter 655 may be step-up converter or a step-down converter. The H-bridge circuit 650 has a first input terminal to receive the first voltage, a second input terminal to receive the second voltage and a pair of output terminals for providing an output modulated voltage to the load.

The modulator circuit is formed of a primary modulator 630 for driving the H-bridge circuit 650 and a secondary modulator 640 for driving the power converter 655. The primary modulator 630 is adapted to generate a first logic signal (PWM1) by comparing the input signal with a first waveform (W1).

Similarly the secondary modulator is adapted to generate a second logic signal (PWM2) by comparing the input signal with a second waveform (W2).

In this example the primary modulator 630 has a primary waveform generator coupled to a primary driver for generating the first logic signal also referred to as first modulated signal (PWM1). Similarly the secondary modulator 640 has a secondary waveform generator coupled to a secondary driver for generating the second logic signal also referred to as a second modulated signal (PWM2).

In operation the primary waveform generator generates the first waveform W1, and the secondary waveform generator generates the second waveform W2. The primary driver receives a filtered input signal Sig from the loop filter 620 and the waveform W1 from the primary waveform generator and generates the first modulated signal PWM1 based on the comparison between Sig and W1. Similarly, the secondary driver receives the filtered input signal Sig from the loop filter 620 and the waveform W2 from the secondary waveform generator and generates the second modulated signal PWM2 based on the comparison between Sig and W2.

The first modulated signal PWM1 is used to drive the H-Bridge, including selecting a non-ground lower rail voltage. This may be achieved using a logic controller (not shown) that receives the PWM1 signal and generates control signals to control switches within the H-bridge. The logic controller may be configured to determine whether a lower rail voltage is a variable power rail or a ground.

The second modulated signal PWM2 is used to modify the power rail voltages of the power converter 655. A multi-level H-Bridge requires two rail voltages from the power converter. The second modulated signal PWM2 changes the first and second rail voltages of the power converter. The function of the PWM2 signal depends on which rail voltages are used at a particular moment in time and how to control the circuit of the power converter to change the rail voltages. This may be achieved using a logic controller (not shown) that receives the PWM2 signal and generates control signals to control switches within the power converter.

Figure 7:
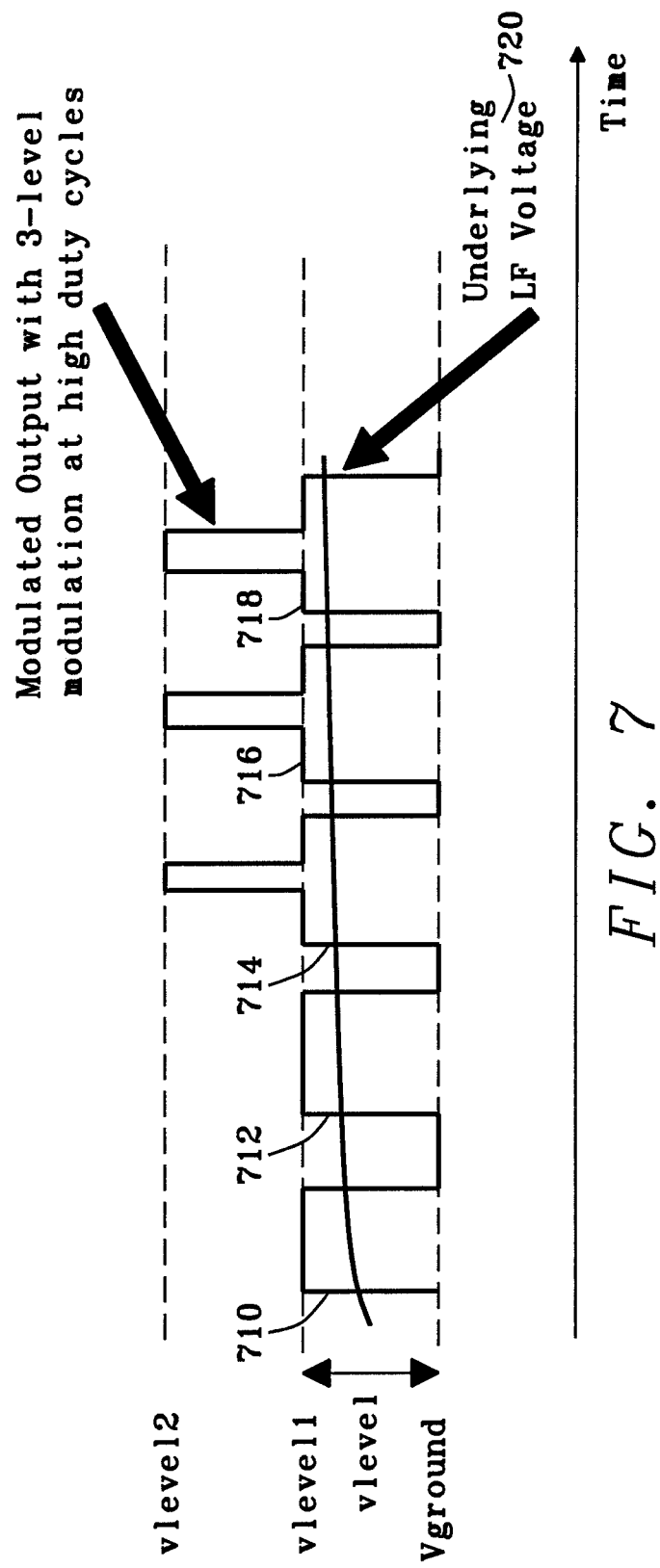
FIG. 7 is a plot of the modulated output voltage generated by the signal amplification circuit of FIG. 6.

FIG. 7 is a plot illustrating the modulated output voltage provided at the output of the H-bridge circuit 650. The modulated output voltage comprises a plurality of pulses. In this plot only five pulses are represented. The pulses 710 and 712 are modulated between two levels: Vground and Vlevel1. As the amplitude of the input signal increases the duty cycle of the modulated signal also increases. When the duty cycle reaches a certain level, the secondary modulation (in this case between Vlevel1 and Vlevel2) starts. The remaining three pulses 714, 716 and 718 are modulated between three levels: Vground, Vlevel1 and Vlevel2. For instance, Vlevel1 may be equal to Vsupply and Vlevel2 equal to 2*Vsupply. The underlying low frequency audio signal 720 is the filtered average value across the output ports of the H-bridge.

This technique can be applied to differential or single-ended audio, using different modulation schemes and for analog or digital control loops.

Compared with other multilevel Class D Amplifiers this approach permits to boost to full integer multiple of supply voltage taking advantage of the EMI radiation benefits of a multi-level approach. Primary and secondary modulation can be synchronized so that there is never more than a single level step on the output, thereby limiting EMI radiation.

Figure 8A:
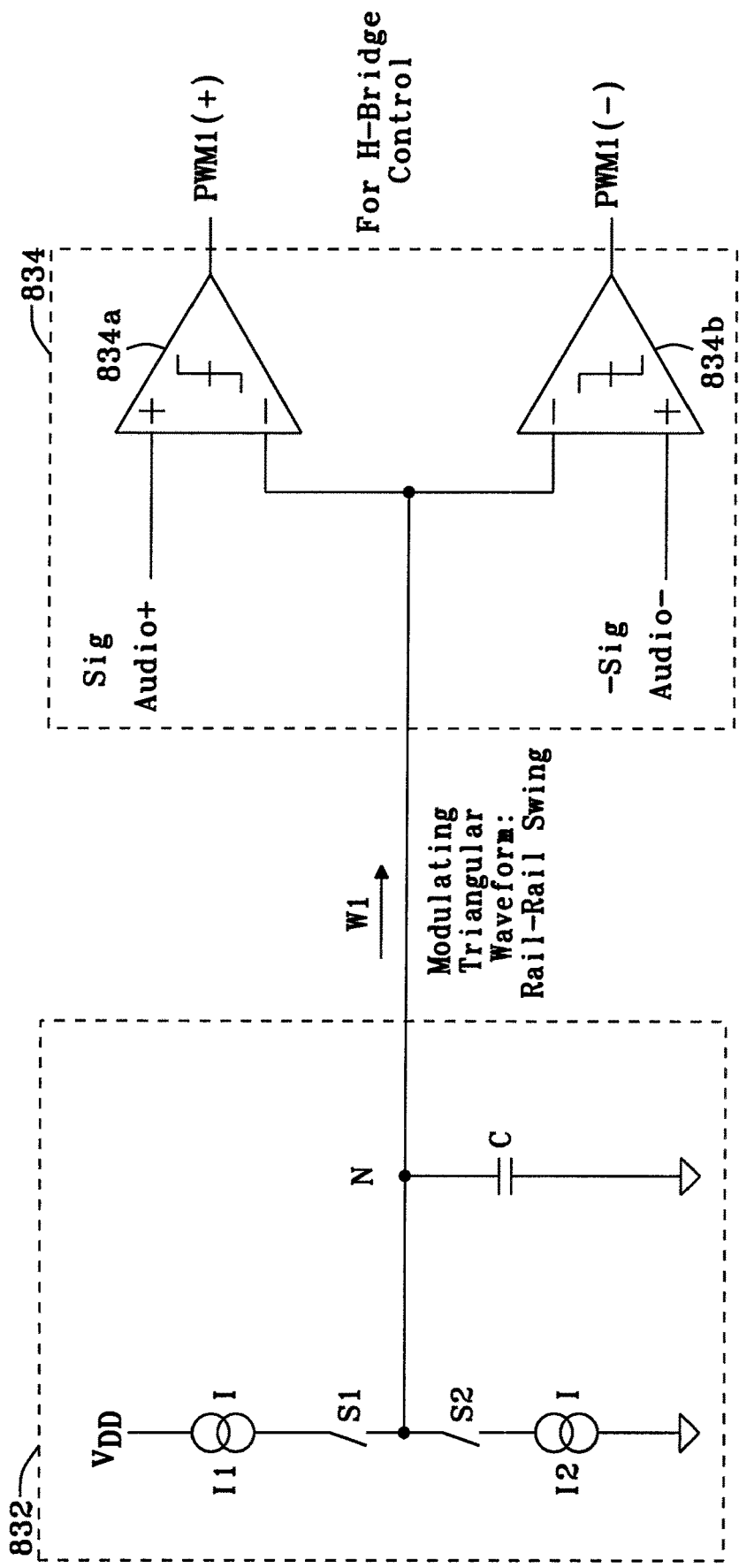
FIG. 8A is a diagram of an exemplary primary modulator for use in the circuit of FIG. 6.

FIG. 8A is a diagram illustrating a primary modulator 830 for generating a primary modulated signal PWM1. The primary modulator 830 includes a primary wave generator 832 coupled to a primary driver 834. The primary wave generator 832 includes two current sources 11, 12, two switches S1, S2 and a capacitor C. The first current source 11 has a first terminal for receiving a voltage such as a rail voltage $V_{DD}$, and a second terminal coupled to output node N via switch S1. The second current source 12 has a first terminal coupled to ground and a second terminal coupled to node N via switch S2. The capacitor C has a first terminal coupled to the output node N and a second terminal coupled to ground.

The switches S1 and S2 are operated to charge and discharge the capacitor C and generate a triangular waveform W1 varying in amplitude between ground and $V_{DD}$.

The primary driver 834 is formed of two comparators: a first comparator 834a for providing a first driving signal PWM1(+), and a second comparator 834b for providing a second driving signal PWM1(−). The first comparator 834a has a first input for instance a non-inverting input for receiving a positive input signal (Sig), and a second input for receiving the first waveform W1 from the waveform generator 832. The second comparator 834b has a first input for instance an inverting input coupled to node N, and a second input for instance a non-inverting input for receiving an inverted input signal (−Sig).

For a positive signal +Sig, when the signal +Sig is greater than W1, the PWM1(+) signal is high (logic 1). When the signal +Sig is lower than W1, the PWM1(+) signal is low (logic 0). Similarly for a negative signal −Sig, when the signal −Sig is greater than W1, the PWM1(−) signal is high (logic 1). When the signal −Sig is lower than W1, the PWM1(−) signal is low (logic 0).

Figure 8B:
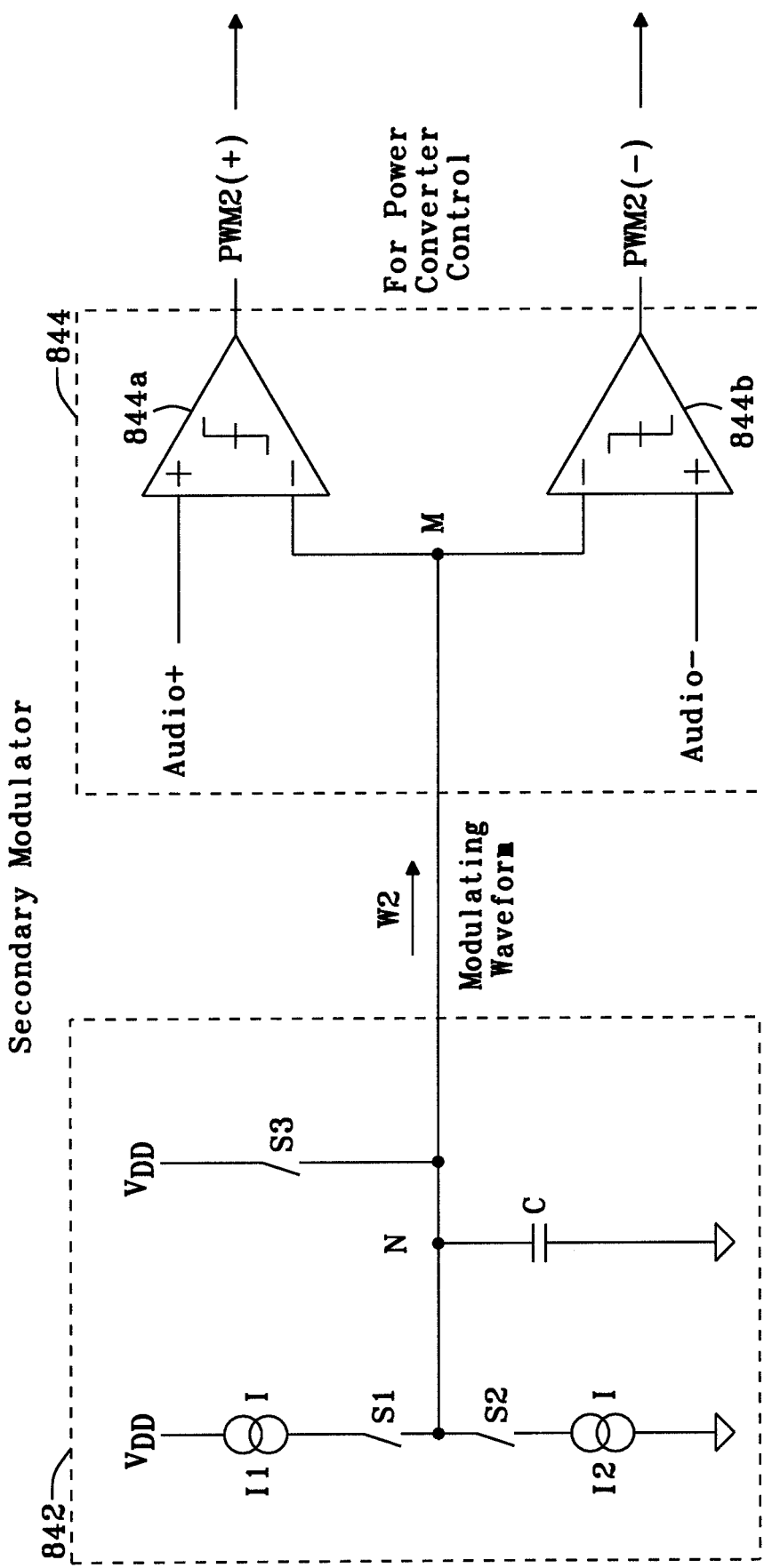
FIG. 8B is a diagram of a secondary modulator for use in the circuit of FIG. 6.

FIG. 8B is a diagram illustrating a secondary modulator 840 for generating a secondary modulated signal PWM2. The secondary modulator 840 includes a secondary wave generator 842 coupled to a secondary driver 844. The secondary wave generator 842 includes two current sources 11, 12, three switches S1, S2, S3 and a capacitor C. The first current source 11 has a first terminal for receiving a voltage such as the rail voltage $V_{DD}$, and a second terminal coupled to output node N via switch S1. The second current source 12 has a first terminal coupled to ground and a second terminal coupled to node N via switch S2. The capacitor C has a first terminal coupled to the $V_{DD}$ via switch S3, and a second terminal coupled to ground.

In operation, the switches S1 and S2 are turned on and off alternately. When S1 is on (closed) and S2 is off (open), a current flows from the first current source 11 into the capacitor C. When S1 is off (open) and S2 is on (closed), a current flows out of the capacitor C into ground. By ramping the current up and down a triangular waveform W2 is generated. The waveform W2 can be stopped and held at a specific level by opening S1 and S2 and closing S3. In this example, the level is held at the rail voltage $V_{DD}$. The slope and start and stop points of the secondary modulation can all be modified.

The secondary driver 844 is formed of two comparators: a first comparator 844a for providing a first driving signal PWM2(+), and a second comparator 844b for providing a second driving signal PWM2(−). The first comparator 844a has a first input for instance a non-inverting input for receiving a positive input signal (Sig), and a second input for instance an inverting input for receiving the secondary waveform W2 from the waveform generator 842.

The second comparator 844b has a first input for instance an inverting input coupled to node N, and a second input for instance a non-inverting input for receiving an inverted input signal (−Sig).

For a positive signal +Sig, when the signal +Sig is greater than W2, the PWM2(+) signal is high (logic 1). When the signal +Sig is lower than W2, the PWM2(+) signal is low (logic 0). Similarly for a negative signal −Sig, when the signal −Sig is greater than W2, the PWM2(−) signal is high (logic 1). When the signal −Sig is lower than W2, the PWM2(−) signal is low (logic 0).

The modulated signal PWM1 is used to drive the H-bridge circuit and the modulated signal PWM2 is used to drive the power converter.

Figure 8C:
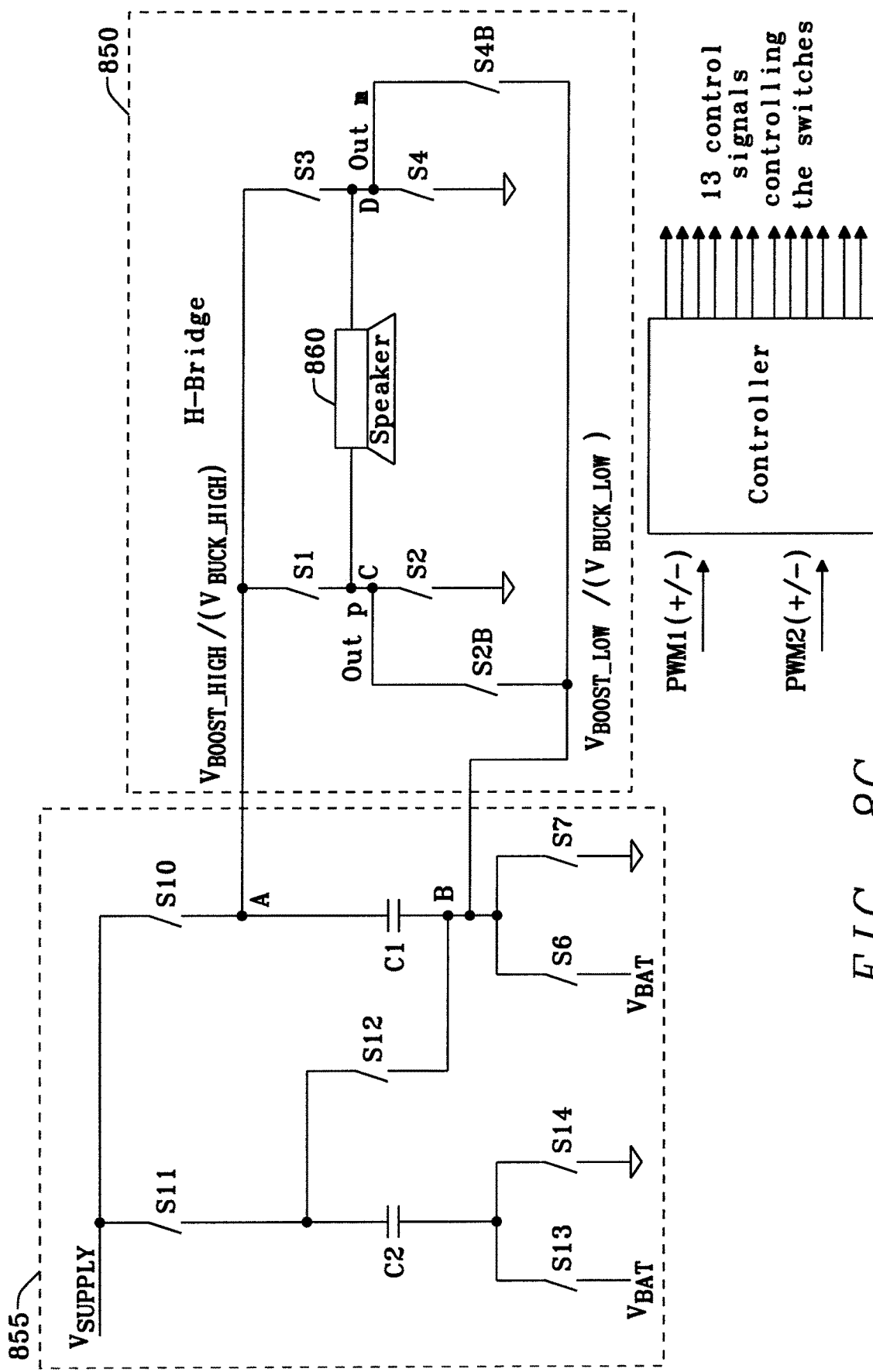
FIG. 8C is a diagram of a power converter coupled to a multi-level H-bridge circuit for use in the circuit of FIG. 6.

FIG. 8C is a diagram of a power converter 855 coupled to a multi-level H-bridge circuit 850. In this example the power converter 855 is a step-up converter implemented as a capacitive boost converter. The boost converter 855 has an input for receiving a supply voltage $V_{SUPPLY}$ for instance from a battery and two outputs for providing a first power converter output voltage Vboost_High and a second power converter output voltage Vboost_Low, respectively.

The H-bridge 850 has two input terminals A, B for receiving the voltages Vboost_High and Vboost_Low, respectively and two output terminals (C: positive terminal, and D: negative terminal) coupled to the first and second terminals of the load (speaker 860). The first output C is coupled to the first input A via switch S1 and to ground via switch S2. The first output C is also coupled to the second input B via switch S2B. Similarly, the second output D is coupled to the first input A via switch S3 and to ground via switch S4. The second output D is also coupled to the second input B via switch S4B. Therefore, the outputs of the H bridge can receive three different voltage levels Vboost_High, Vboost_Low or ground.

The multi-level H-bridge circuit 850 is operable in a plurality of modes corresponding to different voltage ranges depending on the amplitude of the input signal. In this example the H-bridge circuit is operable in a first mode when the input signal has an amplitude within a first region (low amplitude region), a second mode when the input signal has an amplitude within a second region (intermediate region), and a third mode when the input signal has an amplitude within a third region (high amplitude region).

The modulated signal PWM1 is used to drive the H-bridge circuit and the modulated signal PWM2 is used to drive the power converter. When PWM1+ is high, S1 is turned on and S2/S2B are turned off. When PWM1+ is low, S2/S2B are turned on depending on whether the lower rail is ground or not. When PWM1— is high, S3 is turned on and S4/S4B are turned off. When PWM1— is low, S4/S4B are turned on depending on whether the lower rail is ground or not. PWM2 is used to shift the first and second output voltages of the power converter Vboost_High, Vboost_Low to the next level.

It will be appreciated that the proposed technique can be applied to unipolar applications. For instance the H-bridge circuit 850 may be adapted to work with a single-ended haptic device. In this case the H-bridge circuit may be a half an H-bridge with node D connected directly to ground (without switches S3 or S4B). The switches S1, S2 and S2B would then be operated to control the voltage at node C. In another implementation, the converter 855 may be implemented as a step-down converter for providing fractions of the supply voltage.

Figure 8D:
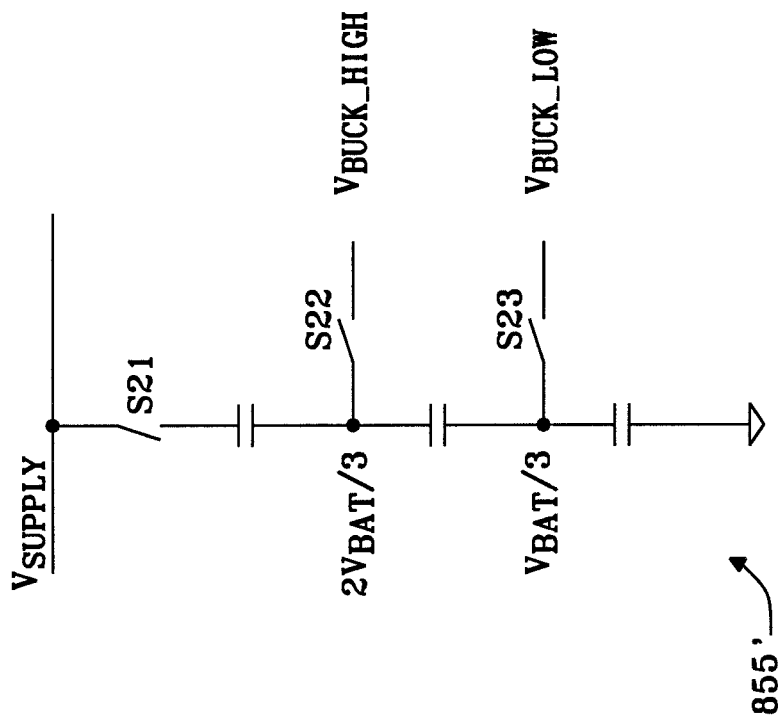
FIG. 8D is a diagram of an exemplary step-down power converter implemented as a capacitive divider for use in the circuit of FIG. 6.

FIG. 8D is a diagram of a step-down power converter implemented as a capacitive divider. The buck converter 855' has an input for receiving an input voltage Vsupply, for instance from a battery and two outputs for providing a first output voltage Vbuck_High and a second voltage Vbuck_Low, respectively. In this specific example Vbuck_High is equal to ⅔ of the supply voltage Vsupply, and Vbuck_Low is equal to ⅓ of Vsupply. The power converter may be duplicated so that while one converter is supplying, the other is recharging, hence performing ping-pong operation.

Figure 9:
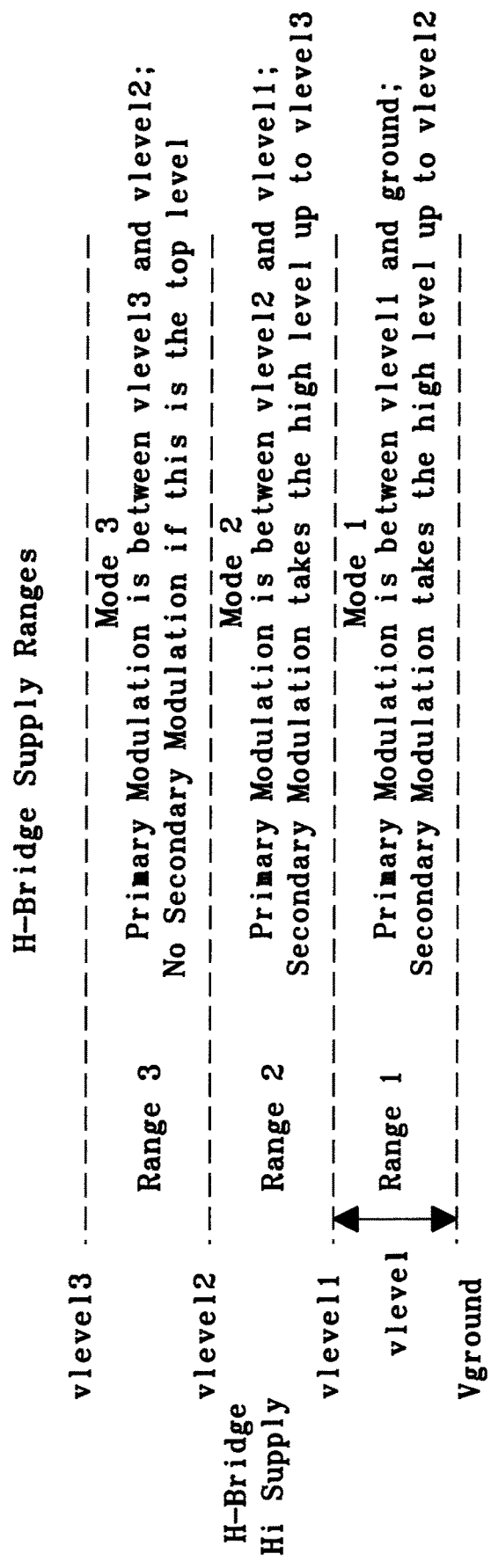
FIG. 9 is a diagram illustrating various modes of operation of the multi-level H-bridge.

FIG. 9 is a diagram illustrating various modes of operation of the multi-level H-bridge. In the first mode, the output voltage of the H-bridge is modulated using a primary modulation between vlevel1 and ground (range 1) and when the PWM2 signal is triggered using a secondary modulation between vlevel1 and vlevel2 (range 2). In the second mode corresponding to range 2, the output voltage of the H-bridge is modulated using a primary modulation between vlevel2 and vlevel1 (range 2) and when the PWM2 signal is triggered using a secondary modulation between vlevel2 and vlevel3 (range 3). In the third mode corresponding to range 3, the output voltage of the H-bridge is modulated using a primary modulation between vlevel3 and vlevel2 (range 3).

Since vlevel3 is the top voltage level there is no secondary modulation. The difference between vlevel1 and vlevel2 is vlevel. Similarly the difference between vlevel3 and vlevel2 is also vlevel.

It will be appreciated that when inverting the polarity (voltage applied across the positive or negative terminals of the H bridge), corresponding negative range s would exist, providing negative modulated output voltages. It will also be appreciated that additional vlevels may be added following the same principle.

Exemplary operation in the first mode (using range 1 and range 2), the second mode (using range 2 and range 3) and the third mode (using range 3) is presented with reference to FIG. 8C.

A) First mode using range 1 for primary modulation and range 2 for secondary modulation.

In the first range, the output of the H-bridge (terminal C for positive voltage or terminal D for negative voltages)—is switched between the first H-Bridge Supply level (vlevel1) and ground. For positive outputs, D is connected to ground through S4 and for negative outputs, C is connected to ground through S2. The operation of S1, S2 and S2B are mutually exclusive (can never be on simultaneously). Similarly the operation of S3, S4 and S4B are mutually exclusive. The switches S2B and S4B are turned off (open), and the H-Bridge operates using the switches S1, S2, S3 and S4. When the switches S1 and S4 are turned on (closed), the switches S2 and S3 are turned off (open). A voltage Vboost_High=Vlevel1 is applied at the output C, and output D is connected to ground.

For positive outputs in the first range, the switches S1 and S2 are toggled to change the H-Bridge output voltage between Vboost_High and Ground. For negative outputs, S2 is turned on to connect C to ground and the switches S2 and S3 are toggled to change the voltage at node D between Vboost_High and Ground.

When the switches S1 and S4 are turned off, the switches S2 and S3 are turned on. A voltage Vboost_High=Vlevel1 is applied at the output D, and output C is connected to ground. As one approaches the top of range 1, the secondary modulation takes place, and the positive rail is boosted up to its second level (vlevel2).

The boost converter 855 is operated to provide Vboost_High=2*Vsupply (vlevel2) and Vboost_Low=Vsupply (vlevel1). The two modulators are synchronized so that the secondary modulation takes place within the period of primary modulation, ensuring that only a single vlevel step takes place across the H-Bridge outputs. For positive outputs, S4 is on and the switches S1/S2B are modulated (S2 and S3 are off). When S1 is on and S2B is off, the voltage at output C is 2*Vsupply. When S1 is off and S2B is on, the voltage at the output C is Vsupply. For negative outputs, S2 is on and the switches S3/S4B are modulated (S1 and S4 are off). When S3 is on and S4B is off, the voltage at output D is 2*Vsupply. When S3 is off and S4B is on, the voltage at output D is Vsupply.

B) Second mode using range 2 for primary modulation and range 3 for secondary modulation.

As the Sig amplitude increases, the next range (range 2) is triggered, and C (D for negative outputs) is switched between vlevel2=VBoost_High and vlevel1=VBoost_Low levels. Initially in the second range, there will be no secondary modulation but as the top of that range is approached, secondary modulation will be triggered, and the H-Bridge supply will be boosted up to the next level, that is vlevel3. When the input signal Sig is low within the second range, the modulated output voltage is modulated using the primary modulation between Vsupply and 2Vsupply, and the PWM2 signal remains low. For positive outputs, S4 is on and the switches S1/S2B are modulated (S2 and S3 are off).

When S1 is on and S2B is off, the voltage at output C is 2*Vsupply. When S1 is off and S2B is on, the voltage at the output C is Vsupply. For negative outputs, S2 is on and the switches S3/S4B are modulated (S1 and S4 are off). When S3 is on and S4B is off, the voltage at output D is 2*Vsupply. When S3 is off and S4B is on, the voltage at output D is Vsupply.

When the input signal Sig increases within range 2, the secondary modulation starts. For secondary modulation, S1 remains on and Vboost_High is taken up to vlevel3. The primary and secondary modulations are synchronized so that secondary modulation always takes place within a high level of the primary modulation. The boost converter 855 is operated to provide Vboost_High=3*Vsupply (vlevel3) and Vboost_Low=2*Vsupply (vlevel2). For positive outputs, S4 is on and the switches S1/S2B are modulated (S2 and S3 are off). When S1 is on and S2B is off, the voltage at output C is 3*Vsupply. When S1 is off and S2B is on, the voltage at the output C is 2*Vsupply. For negative outputs, S2 is on and the switches S3/S4B are modulated (S1 and S4 are off). When S3 is on and S4B is off, the voltage at output D is 3*Vsupply. When S3 is off and S4B is on, the voltage at output D is 2*Vsupply.

C) Third mode using range 3 for primary modulation.

As the Sig amplitude keeps increases, the next range (range 3) is triggered.

In the third mode the H-Bridge circuit operates using two voltage levels comprising the first power-converter supply voltage (in this case 2*Vsupply) and the second power-converted supply (in this case voltage 3*Vsupply) to provide a modulated output voltage modulated between these two levels: 2*Vsupply and 3*Vsupply. The modulation is achieved using S1/S2B for positive outputs and S3/S4B for negative outputs. In the topmost range (positive or negative), there will be no secondary modulation as a further H-Bridge rail is unavailable.

It will be appreciated that following the same approach additional modes may be created corresponding to additional voltage range s. It will also be appreciated that the capacitive boost converter may be replaced by another type of boost converter, for instance an inductive boost converter.

In addition, secondary modulation can be applied towards the bottom of a range, to take the supply voltage down and further spread the modulation over the range transition.

Figure 10:
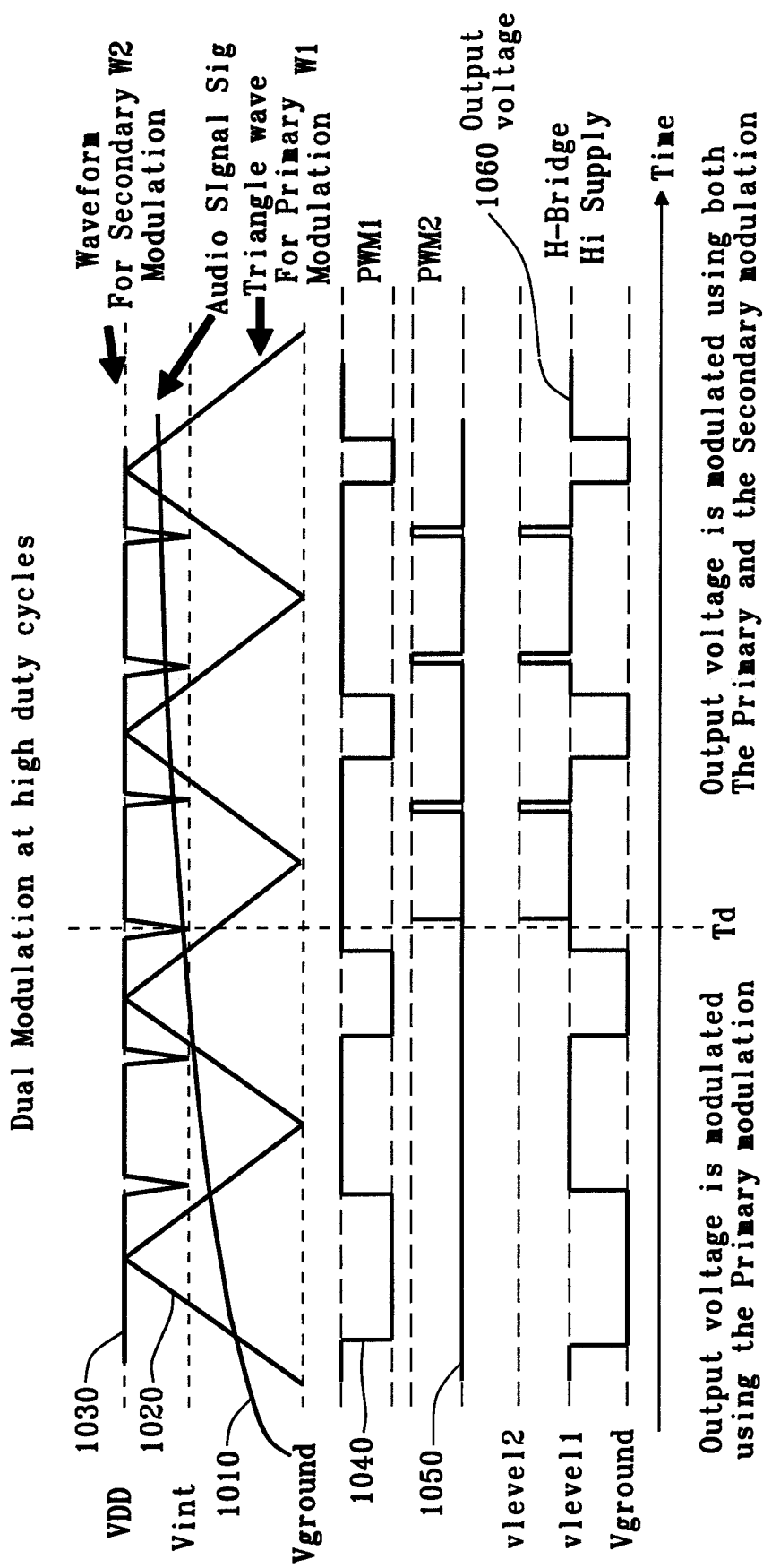
FIG. 10 is a waveform diagram illustrating the working of the signal amplifier as described with reference to FIGS. 6 to 9.

FIG. 10 is a waveform diagram illustrating the working of the signal amplifier as described with reference to FIGS. 6 to 9. FIG. 10 shows the filtered input audio signal Sig 1010, the primary waveform W1 1020 generated by the primary modulator, the secondary waveform W2 1030 generated by the secondary modulator, the primary modulated signal PWM1 1040, the secondary modulated signal PWM2 1050, and the output modulated voltage 1060. Operation is presented for operation in the first mode.

The first waveform W1 1020 is a first triangular waveform that varies in amplitude between ground and $V_{DD}$.

The second waveform W2 1030 is a second triangular waveform. In this case the waveform W2 varies in amplitude between $V_{DD}$ and an intermediate voltage Vint. The intermediate voltage has a value that is less than $V_{DD}$. The second triangular waveform W2 has a period comprising a first portion during which the waveform remains at a constant value $V_{DD}$, and a second portion during which the waveform varies between $V_{DD}$ and Vint.

Operation is illustrated for the first mode of operation. The signal Sig 1010 increases in amplitude as a function of time. As a result the duty cycle of the primary modulated signal PWM1 also increases. Before time Td, the secondary modulated signal PWM2 is low and the output voltage 1060 is modulated using a primary modulation Vground and Vlevel1. At Td the secondary modulated signal PWM2 goes high and the output voltage 1060 is further modulated by the secondary modulation between vlevel1 and vlevel2.

This approach can be applied irrespective of whether the signal is rising or falling. Synchronizing the primary and secondary modulation waveforms avoids any steps greater than vlevel across the H-Bridge, thereby limiting EMI radiation.

Figure 11:
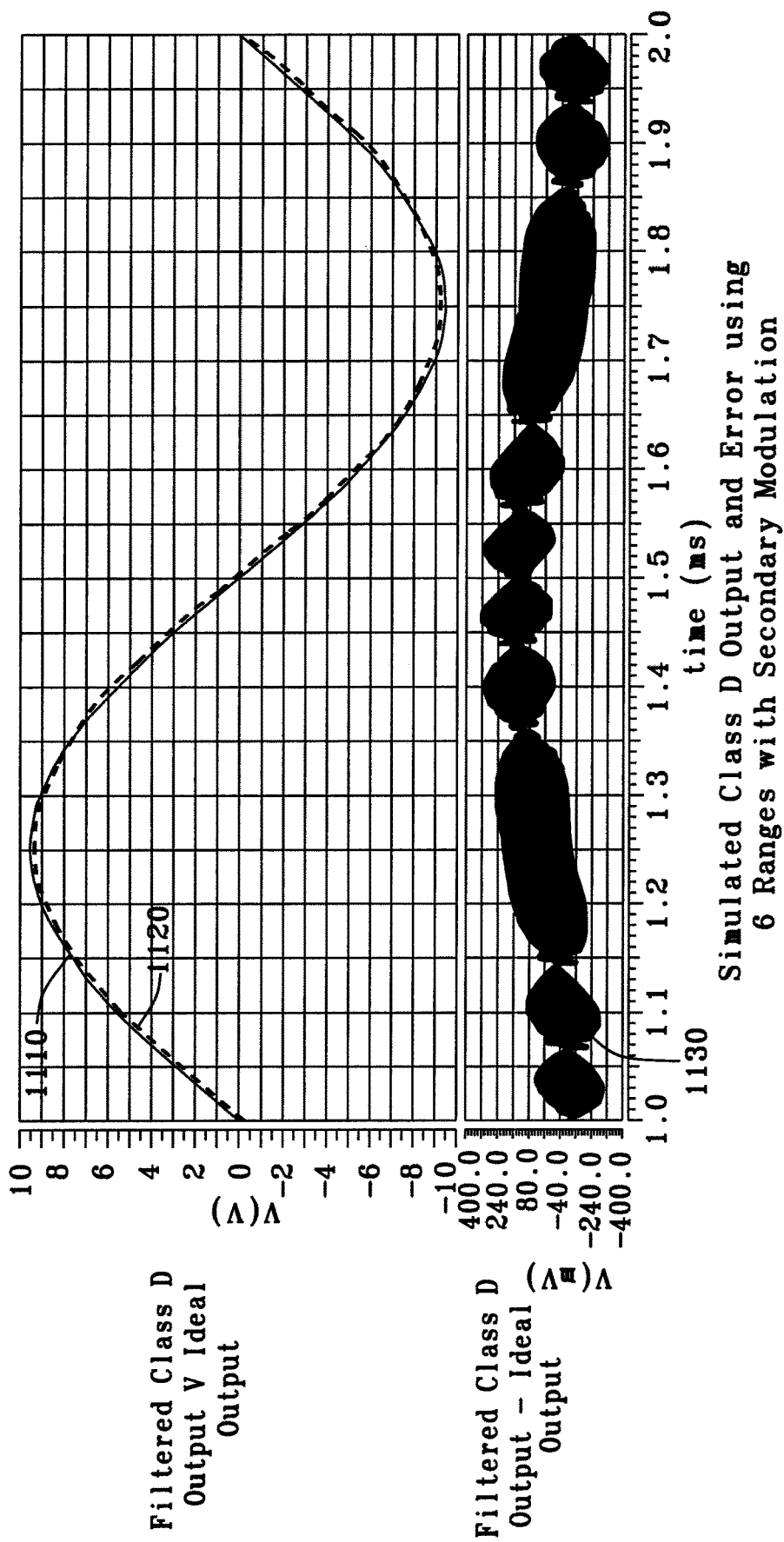
FIG. 11 is a simulation of a class D output signal performed using differential signals with six charge pump levels.

FIG. 11 is a simulation of a class D output signal performed using differential signals with 6 charge pump levels. Waveform 1110 represents the ideal output, and waveform 1120 is the output obtained after filtering to eliminate the high frequency switching component. Waveform 1130 shows the difference between 1120 and 1110. The six levels cover+/−3Vsupply, each range Vsupply wide with no overlap between range s (three levels from the power converter: 1×, 2× and 3×, connected to opposite sides of the H-Bridge to provide a bipolar output). The behavioral Class D model is fully differential and both positive and negative secondary modulation have been used. The secondary modulation has been used on both positive and negative outputs.

Figure 12:
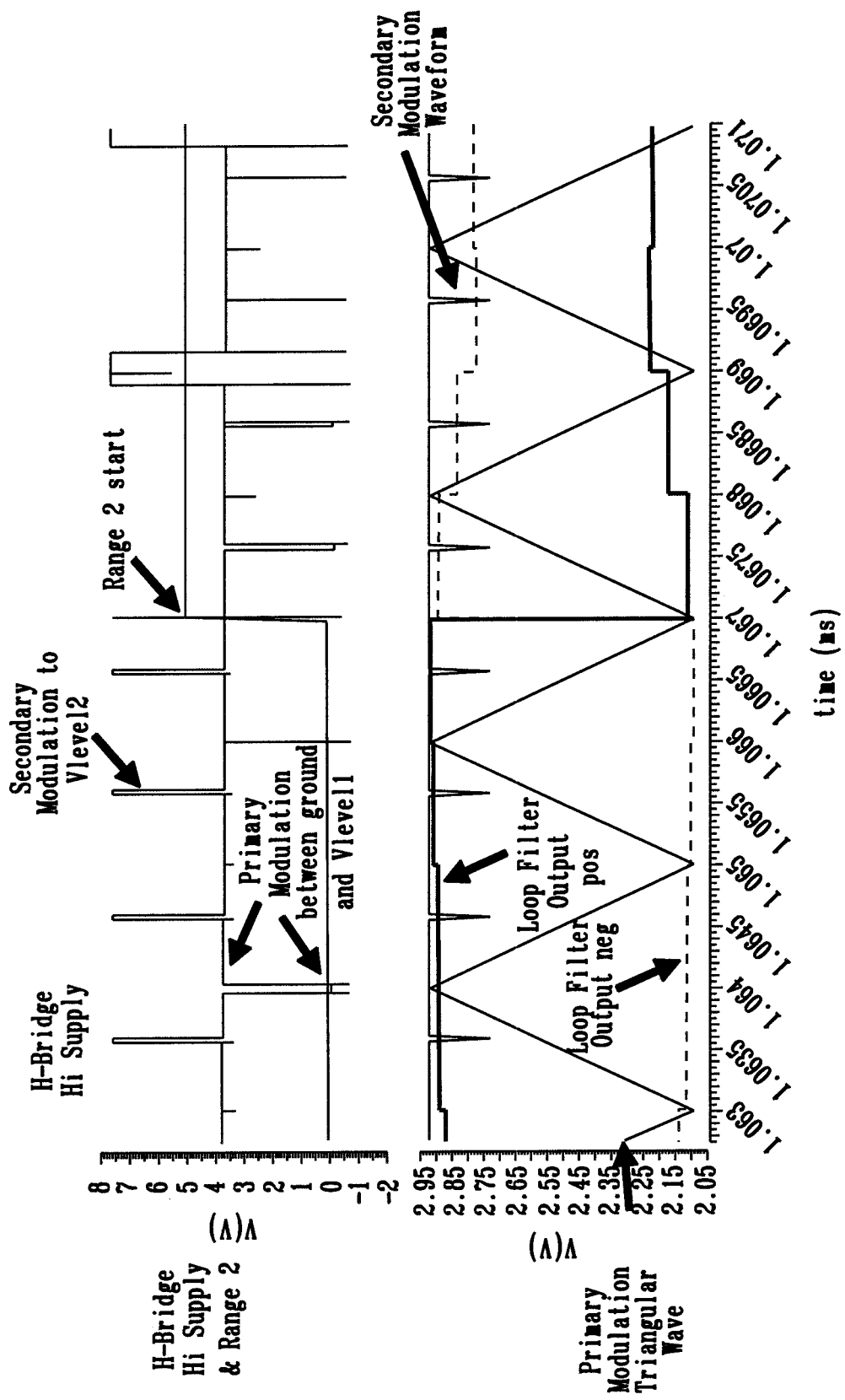
FIG. 12 is a simulation of a modulated output voltage obtained for a multilevel H-bridge operating in the first mode and the second mode.

FIG. 12 is a simulation showing the transition between range 1 and range 2.

The lower trace shows the differential (positive and negative) loop filter output signals together with the primary and secondary waveforms W1 and W2 for primary and secondary modulation. The resulting differential output is shown in the upper trace. At the transition between range 1 and range 2, the positive and negative loop filter output signals are inverted to facilitate continuous operation.

A skilled person will appreciate that variations of the disclosed arrange ments are possible without departing from the disclosure. For instance, the H-bridge circuit may be adapted to work with a haptic device. Accordingly, the above description of the specific embodiment is made by way of example only and not for the purposes of limitation. It will be clear to the skilled person that minor modifications may be made without significant changes to the operation described.

What is claimed is:

1. A signal amplifier comprising:
a power converter;
an H-bridge circuit;
a modulator circuit adapted to generate a first logic signal to control the H-bridge circuit and a second logic signal to control the power converter, wherein the first logic signal is generated by comparing an input signal with a first waveform; and wherein the second logic signal is generated by comparing the input signal with a second waveform;
wherein the power converter is adapted to provide a first voltage and a second voltage; and
wherein the H-bridge circuit has a first input terminal to receive the first voltage, a second input terminal to receive the second voltage and a pair of output terminals for providing an output modulated voltage to a load,
the H-bridge circuit being adapted to generate the output modulated voltage using a primary modulation when the second logic signal is in a first logic state and using a secondary modulation when the second logic signal is in a second logic state.

2. The signal amplifier as claimed in claim 1, wherein the first waveform is a first triangular waveform.

3. The signal amplifier as claimed in claim 2, wherein the first triangular waveform varies between ground and a rail voltage.

4. The signal amplifier as claimed in claim 3, wherein the second waveform is a second triangular waveform.

5. The signal amplifier as claimed in claim 4, wherein the second triangular waveform varies between the rail voltage and an intermediate voltage, the intermediate voltage having a value that is less than the rail voltage.

6. The signal amplifier as claimed in claim 5, wherein the second triangular waveform has a period comprising a first portion during which the waveform remains at a constant value, and a second portion during which the second triangular waveform varies between the rail voltage and the intermediate voltage.

7. The signal amplifier as claimed in claim 4, wherein the first triangular waveform and the second triangular waveform are synchronized.

8. The signal amplifier as claimed in claim 1, wherein the H-bridge circuit comprises:
- a first switch to couple a first output terminal to the first input terminal;
- a second switch to couple the first output terminal to ground;
- a third switch to couple a second output terminal to the first input terminal;
- a fourth switch to couple the second output terminal to ground;
- a fifth switch to couple the first output terminal to the second input terminal; and
- a sixth switch to couple the second output terminal to the second input terminal.

9. The signal amplifier as claimed in claim 1, wherein the power converter is a step-up converter.

10. The signal amplifier as claimed in claim 1, wherein the power converter is a step-down converter.

11. The signal amplifier as claimed in 1, wherein the H-bridge circuit is operable in a first mode when the input signal has an amplitude within a first region, a second mode when the input signal has an amplitude within a second region, and a third mode when the input signal has an amplitude within a third region.

12. The signal amplifier as claimed in claim 11, wherein the first voltage and the second voltage provided by the power converter have different values in different modes.

13. The signal amplifier as claimed in claim 11, wherein in the first mode, the primary modulation is between a first voltage value and ground, and wherein the secondary modulation is between the first voltage value and a second voltage value.

14. The signal amplifier as claimed in claim 13, wherein in the second mode, the primary modulation is between the second voltage value and the first voltage value, and wherein the secondary modulation is between the second voltage value and a third voltage value.

15. The signal amplifier as claimed in claim 14, wherein in the third mode, the primary modulation is between the third voltage value and the second voltage value.

16. The signal amplifier as claimed in claim 1, wherein the signal amplifier is a multi-level class D amplifier.

17. The signal amplifier as claimed in claim 1, wherein one output terminal is directly connected to ground.

18. A method of amplifying an input signal, the method comprising:
- receiving an input signal;
- generating a first logic signal by comparing the input signal with a first waveform;
- generating a second logic signal by comparing the input signal with a second waveform;
- providing a power converter adapted to provide a first voltage and a second voltage;
- providing a H-bridge circuit having a first input terminal to receive the first voltage, a second input terminal to receive the second voltage and a pair of output terminals for providing an output modulated voltage to a load;
- generating the output modulated voltage using a primary modulation when the second logic signal is in a first logic state and using a secondary modulation when the second logic signal is in a second logic state; and
- applying the modulated output voltage to the load;
- controlling the H-bridge using the first logic signal and controlling the power converter using the second logic signal.

19. The method as claimed in claim 18, wherein the output modulated voltage has a duty cycle, and wherein when the duty cycle is below a threshold value, the output modulated voltage is modulated using the primary modulation, and when the duty cycle is equal to or greater than the threshold value, the output modulated voltage is modulated using the secondary modulation.

* * * * *